United States Patent
Henzler et al.

(10) Patent No.: US 7,696,829 B2
(45) Date of Patent: Apr. 13, 2010

(54) FREQUENCY SYNTHESIZER AND METHOD

(75) Inventors: Stephan Henzler, München (DE);
Siegmar Köppe, München (DE)

(73) Assignee: Infineon Technologies AG, Munich (DE)

( * ) Notice: Subject to any disclaimer, the term of this patent is extended or adjusted under 35 U.S.C. 154(b) by 144 days.

(21) Appl. No.: 11/524,674

(22) Filed: Sep. 21, 2006

(65) Prior Publication Data

US 2008/0074201 A1 Mar. 27, 2008

(51) Int. Cl.
*H03L 7/093* (2006.01)
*H03C 3/06* (2006.01)

(52) U.S. Cl. .................. 331/17; 331/1 A; 327/156; 332/100; 332/127

(58) Field of Classification Search .......... 331/16, 331/17, 18, 25, 1 A; 327/156; 375/373, 375/375, 376; 332/100, 101, 102, 117, 127, 332/135
See application file for complete search history.

(56) References Cited

U.S. PATENT DOCUMENTS

| | | | | |
|---|---|---|---|---|
| 5,334,952 | A * | 8/1994 | Maddy et al. | 331/1 A |
| 5,892,407 | A * | 4/1999 | Ishii | 331/17 |
| 6,549,078 | B1 * | 4/2003 | Sridharan et al. | 331/17 |
| 6,856,180 | B1 | 2/2005 | Starr et al. | |
| 7,292,618 | B2 * | 11/2007 | Tal et al. | 375/132 |
| 7,327,196 | B2 * | 2/2008 | Goldberg | 331/16 |
| 2003/0160641 | A1 | 8/2003 | Starr et al. | |
| 2004/0131136 | A1 * | 7/2004 | Fast et al. | 375/376 |
| 2004/0223574 | A1 * | 11/2004 | Kuo et al. | 375/375 |
| 2005/0093584 | A1 | 5/2005 | Meacham | |
| 2005/0206458 | A1 * | 9/2005 | Wu | 331/1 A |

OTHER PUBLICATIONS

"All-Digital PLL and GSM/EDGE Transmitter in 90 nm CMOS", Robert Bogdan Staszewski, John Wallberg, Sameh Rezeq, Chih-Ming Hung, Oren Eliezer, Sudheer Vemulapalli, Chan Fernando, Ken Maggio, Roman Staszewski, Nathen Barton, Meng-Chang Lee, Patrick Cruise, Mitch Entezari, Khurram Muhammad and Dirk Leipold, ISSCC 2005/ Session 17/ RF Cellular ICs/17.5, 2005 IEEE International Solid-State Circuits Conference, 3 pgs., Feb. 2005.

"All-Digital Phase-Domain TX Frequency Synthesizer for Bluetooth Radios in 0.13 μm CMOS", Robert Bogdan Staszewski, Chih-Ming Hung, Ken Maggio, John Wallberg, Dirk Leipold and Poras T. Balsara, ISSCC 2004, Session 15/ Wireless Consumer ICs/15.3, 2004 IEEE International Solid-state Circuits Conference, 10 pgs., Feb. 2004.

* cited by examiner

*Primary Examiner*—Robert Pascal
*Assistant Examiner*—Ryan J Johnson
(74) *Attorney, Agent, or Firm*—Eschweiler & Associates, LLC

(57) ABSTRACT

A synthesizer arrangement includes an oscillator, a phase detector, and a loop filter that form a phase-locked loop. The loop filter is coupled to a control unit to activate a respective set of internal states out of a plurality of sets of internal states.

25 Claims, 7 Drawing Sheets

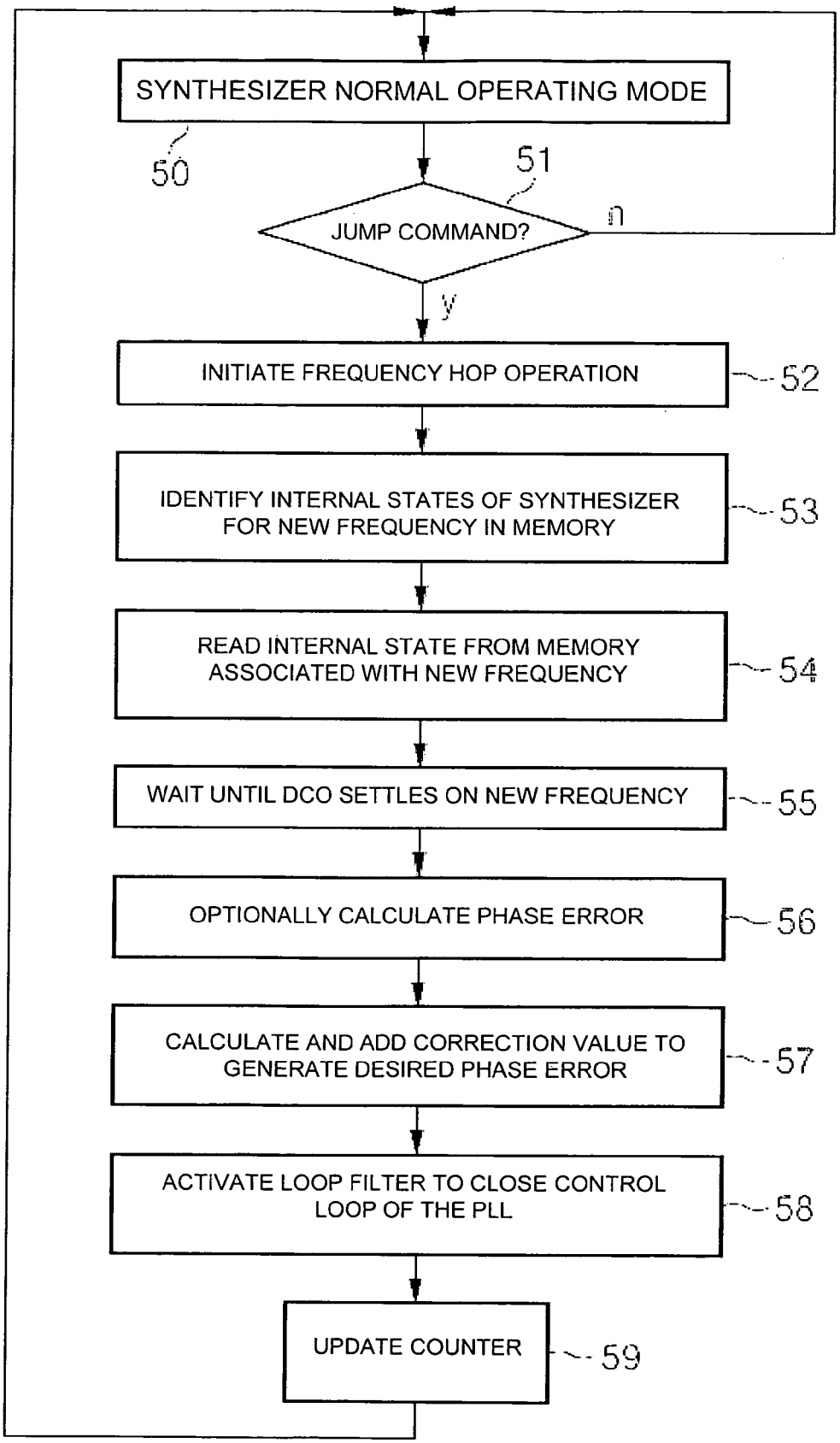

FREQUENCY SYNTHESIZER AND METHOD

FIELD OF THE INVENTION

The invention relates to the field of synthesizing frequencies. In particular, the invention relates to a frequency synthesizer, a phase-locked loop and a frequency-hopping synthesizer, and furthermore to a method for initializing a phase-locked loop and a method of frequency-hopping in a synthesizer.

BACKGROUND OF THE INVENTION

In mobile communication systems, a frequency-hopping technique may be used. For example, the transmit-receive frequency changes dynamically when using frequency division. In applications like ultra-wide band (UWB), a change of frequency and/or a change of channel should be completed within nanoseconds. However, in a phase-locked loop a settling process on a new channel usually takes several microseconds, so that a single PLL is less suited for frequency synthesis for a frequency-hopping system.

Conventional fast frequency-hopping synthesizers generate a basic frequency using conventional PLL techniques. The signal thus generated is mixed with a low-frequency signal in a mixer and is filtered subsequently. The basic frequency can be varied by an offset, achieving different frequency channels. The low-frequency signal can be generated using a periodically addressed read-only memory (ROM) with subsequent digital-to-analog conversion.

As an alternative, conventional frequency-hopping synthesizers may use a single-sideband mixer architecture.

The generation of additional low-frequency signals consumes more power and occupies additional chip area when implemented with integrated circuit technology.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

In one embodiment, a frequency-hopping synthesizer comprises an oscillator, a phase detector and a loop filter that are coupled together in order to form a phase-locked loop, wherein the loop filter comprises means to activate a respective set of internal states out of a plurality of sets of internal states.

An embodiment of a method of initializing a phase-locked loop comprises configuring the phase-locked loop to provide a first frequency, activating the phase-locked loop, when the phase-locked loop has locked onto the first frequency, and writing a set of internal states of the phase-locked loop corresponding to the first frequency into a memory.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The text below explains the invention in detail using exemplary embodiments with reference to the drawings in which FIG. 10 is a flowchart illustrating an exemplary embodiment of a method of frequency-hopping.

DETAILED DESCRIPTION OF THE INVENTION

Figure 1:
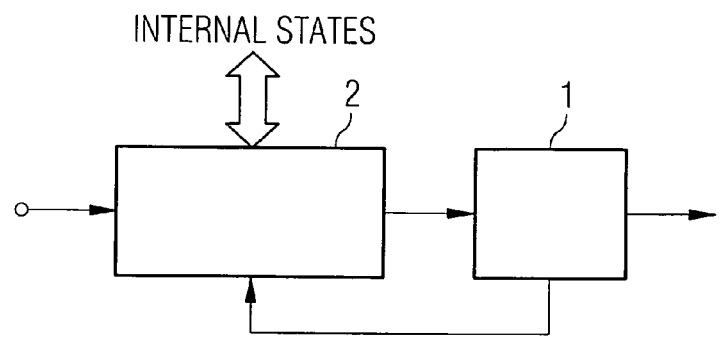
FIG. 1 is a block diagram illustrating an exemplary embodiment of a synthesizer.

According to FIG. 1, a synthesizer arrangement comprises a digitally controlled oscillator (DCO) 1 and a signal processing unit 2. The signal processing unit 2 includes a phase/frequency detector having a first input coupled to an output of the digitally controlled oscillator 1, and having a second input. The signal processing unit 2 further comprises a digital loop filter with a means for reading and/or writing internal states of the digital loop filter. The signal processing unit, comprising the phase/frequency detector and the digital loop filter, controls the output frequency of the digitally controlled oscillator 1.

According to one embodiment of the invention, the frequency synthesizer comprises a fast-hopping frequency synthesizer that switches between several frequencies. The frequency synthesizer may hop between well defined output frequencies which is useful in the field of UWB communication systems, for example.

The fast-hopping frequency synthesizer, according to one embodiment, comprises a digital phase-locked loop. According to the embodiment, it is no longer necessary to lock, after a frequency-hop was performed, onto a completely new frequency. Instead, every possible desired output frequency of the oscillator can be pre-programmed. When the digital PLL has settled onto one of these frequencies, the internal states of the signal processing unit can be stored. If, during later operation, the respective frequency is used, the internal states corresponding to that frequency may be read back into the signal processing unit 2. This causes the circuit arrangement to resume operation from the already settled operating point which has been left before.

According to one embodiment of the invention, means for reading and/or writing internal states of the digital loop filter are provided. In alternative embodiments, means for reading and/or writing internal states of a phase/frequency detector are provided. In alternative embodiments, means for reading and/or writing internal states of an optional divider are provided. In yet further alternative embodiments, in a cumulative or alternative manner, internal states of the phase/frequency detector may be stored. In yet other embodiments, in a cumulative or alternative manner, internal states of the optional divider may be stored.

Figure 2:
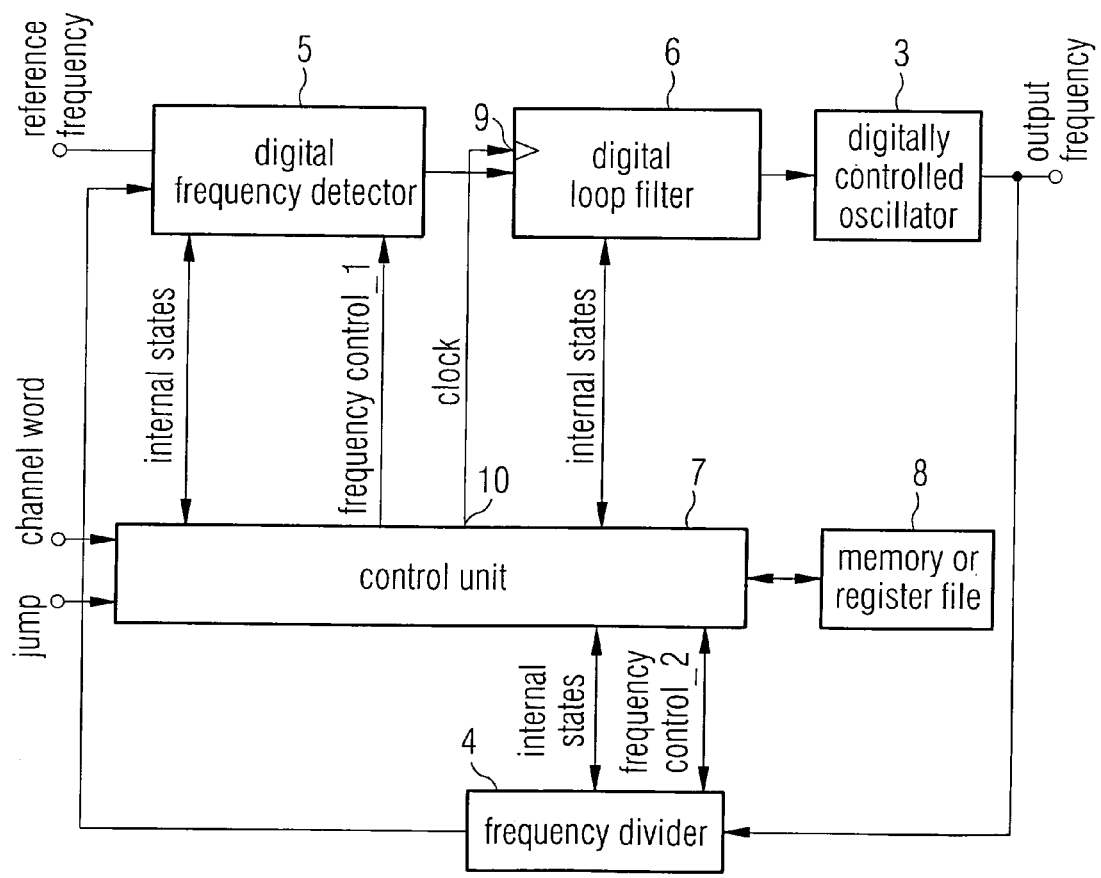
FIG. 2 is a block diagram illustrating another exemplary embodiment of a synthesizer.

FIG. 2 shows an exemplary embodiment of a frequency synthesizer arrangement. The synthesizer arrangement of FIG. 2 comprises a digital phase-locked loop. The phase-locked loop itself comprises a digitally controlled oscillator 3, which provides an output frequency. An output of the digitally controlled oscillator 3 is coupled, via a frequency divider 4, to a first input of a digital frequency detector 5. The frequency divider 4 is optional in the present exemplary embodiment. In one implementation of the synthesizer, the frequency divider may be present as shown in FIG. 2. In another implementation of the synthesizer, the frequency divider may be omitted so that the output of the oscillator 3 is coupled to the respective input of the frequency detector without intervening frequency divider. Another input of the digital frequency detector 5 is for receiving a reference frequency. An output of the digital frequency detector is coupled, via a digital loop filter 6, to an input of the digitally controlled oscillator (DCO) 3.

A control unit 7 is used to read or write internal states. The control unit 7 is coupled, in a bi-directional manner, to a read/write interface of the digital loop filter 6.

The control unit 7 is coupled to a memory unit 8 according to an embodiment. The memory unit 8 may comprise a memory array that may be, for example, a static memory array or a dynamic memory array or a register file.

The control unit 7 provides a clock signal at a clock output 10 for clock gating. The clock output 10 of the control unit 7 is coupled to a clock input 9 of the digital loop filter 6.

The control unit 7 moreover is coupled to the digital frequency detector 5. The internal states of the digital frequency detector are provided at an internal-state output of the digital frequency detector 5, which output is coupled to a corresponding input of the control unit 7. The internal states of the frequency detector 5 are saved when the synthesizer leaves the current operating frequency and hops to another frequency. When the synthesizer returns to the previous frequency, the saved internal states will be written back to the frequency detector. A frequency control_1 signal is used to forward frequency information from the control unit 7 to the frequency detector 5. The frequency detector 5 converts the frequency control_1 signal into detector specific parameters that enable the detector 5 to operate on another frequency. However, in specific embodiments the frequency control_1 signal can be omitted.

The control unit 7 has an input for a channel word and a jump-input. The channel word communicates a desired channel to the control unit and the jump input receives a signal which indicates to jump to a another frequency.

Furthermore, the control unit 7 provides control signals to the optional frequency divider 4. The control unit 7 is able to receive the internal states of the frequency divider and write them back to the frequency divider when the respective frequency of the PLL to which the received internal states belong is desired again. A frequency control_2 signal is used to forward frequency information from the control unit 7 to the divider 4. The frequency divider 4 converts the frequency control_2 signal into divider specific parameters that enable the divider 4 to operate on another frequency.

According to the embodiment of FIG. 2, internal states of the digital loop filter 6 and/or the digital frequency detector 5 and/or the frequency divider 4 can be read from memory by the control unit 7 and written back to the filter 6 and/or detector 5 and/or the divider 4. The same applies to the embodiment of FIG. 3.

For example, every output frequency of the digitally controlled oscillator 3 can be assigned to a set of internal states of the digital loop filter 6 and/or the digital frequency detector 5. The states can be stored in the memory 8 together with the corresponding output frequency. Whenever the corresponding frequency is desired again, meaning that the PLL should settle on that frequency, the stored internal states are written back to the digital loop filter 6 and/or the digital frequency detector 5.

Embodiments of exemplary operation procedures are described in more detail with reference to FIGS. 9 and 10.

In the embodiment of FIG. 2, using a digital frequency detector 5, an additional phase correction is not necessary for certain applications. For example, a phase correction may not be necessary when the loop dynamics of the control loop are so slow that the settling for phase correction is so slow that the resulting error in the output frequency is negligible.

Embodiments of the invention can use one of a phase detector, a frequency detector and a phase/frequency detector. A phase detector determines the phase difference between its input signals; a frequency detector determines the frequency difference between its input signals and a phase/frequency detector determines the difference in phase and frequency between its input signals. The determined difference is provided at the respective output of the detector. A phase detector, a frequency detector and a phase/frequency detector may also be considered a comparator that compares its input signals for a difference in phase, frequency and phase/frequency, respectively.

Figure 3:
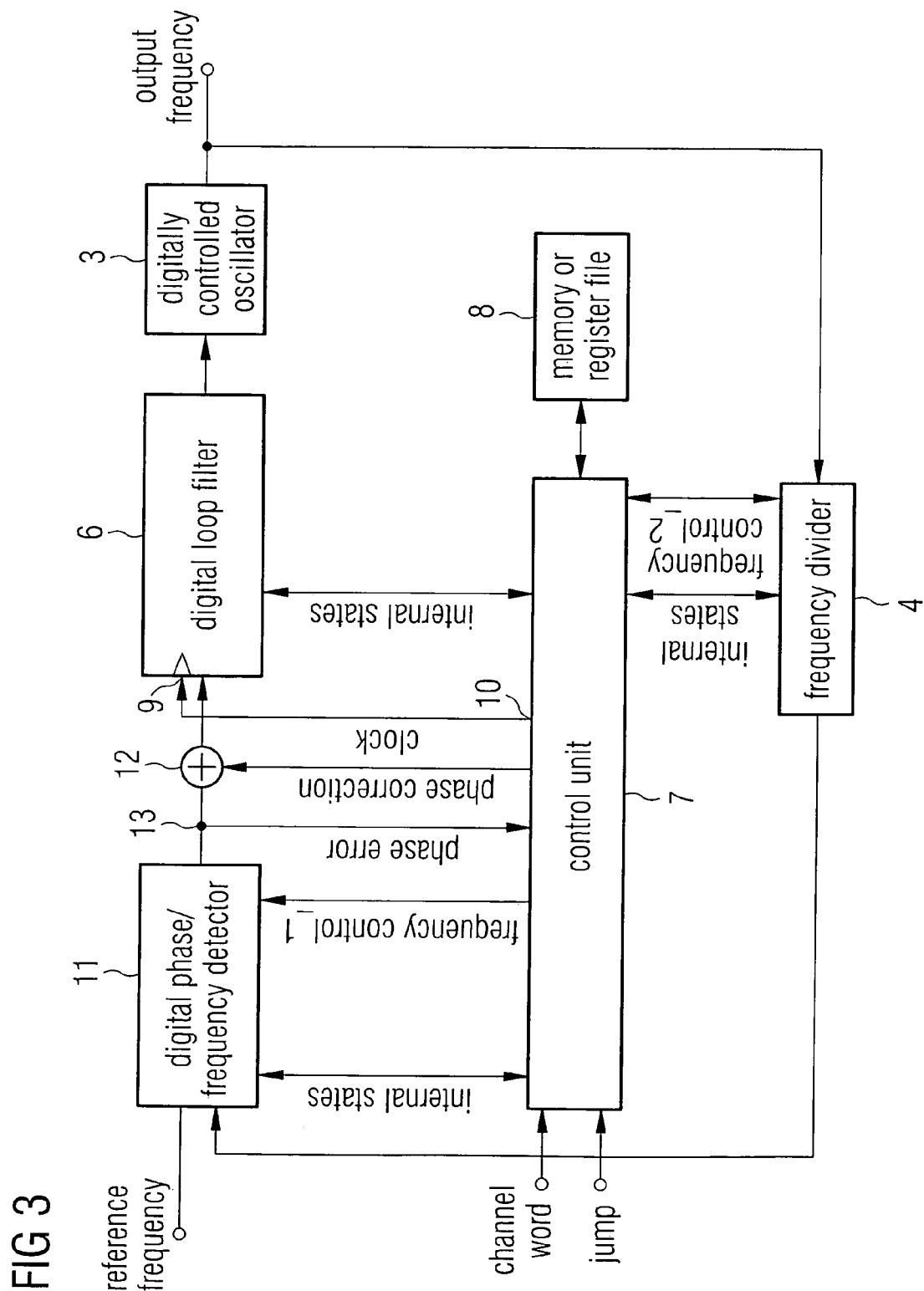
FIG. 3 is a block diagram illustrating a further exemplary embodiment of a synthesizer.

Referring now to another embodiment as shown in FIG. 3, a digital phase/frequency detector 11 is used instead of the digital frequency detector 5. Moreover, a phase correction block 12 is coupled between an output of the digital phase/frequency detector 11 and a signal input of the digital loop filter 6. A phase error detector 13 is coupled to the output of the digital phase/frequency detector.

The phase error detector 13 is coupled to an input of the control unit 7. The control unit 7 has an additional output which is coupled to an input of the phase correction block 12.

Apart from the differences of FIG. 3 with respect to FIG. 2, the circuit of FIG. 3 corresponds to the one shown in FIG. 2, and identical or corresponding elements and functions are not described here again. Also as described in connection with FIG. 2, in one implementation the frequency divider 4 may be present as shown in FIG. 3. In other implementations, the frequency divider may be omitted so that the output of the oscillator 3 is coupled to the respective input of the frequency detector without intervening frequency divider.

According to FIG. 3, in addition to the internal states of the internal loop filter 6 and/or the digital phase/frequency detector 11, a phase error corresponding to the settled state of the phase-locked loop corresponding to a certain output frequency is saved before leaving that frequency and hopping to a different frequency. A saving of states of the loop filter and/or the phase/frequency detector and/or the divider may include the storing of the respective states in a memory or may include the storing of the states in respective registers of a register file or in latches. When hopping back to this frequency, in a first step, the internal states of the digital loop filter 6 and/or the digital phase/frequency detector 11 and/or the divider are restored. After that, before activation of the clock at the input terminal 9 of the filter and reactivating the filter 6, the current phase error will be set to the value of the settled state.

When jumping to another frequency, the phase error at the input of the filter is set to the required value, even if the phase relationship between the reference frequency at an input of the digital phase/frequency detector 11 and the oscillator output frequency is lost due to the jump to another frequency. By doing this, it is avoided that the PLL would try to respond to a phase error that corresponds to a different state, which would result in additional transient effects at the output.

For further details concerning examples of initializing the loop and hopping to a different frequency, it is referred to the embodiments of FIGS. 9 and 10 and the accompanying description below.

Figure 4:
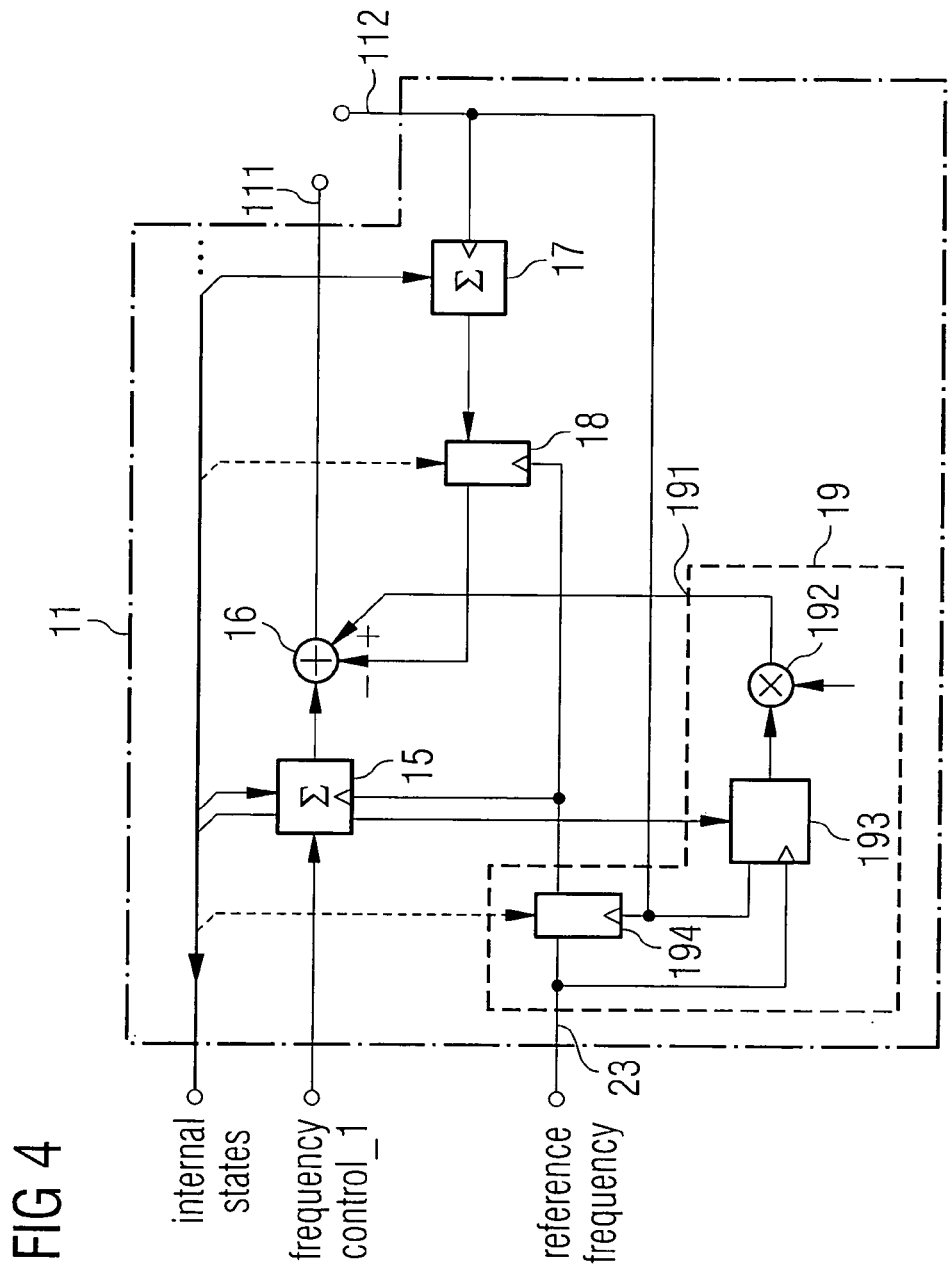
FIG. 4 is a block diagram illustrating an exemplary embodiment of a phase/frequency detector.

FIG. 4 shows an example of an embodiment of the phase/frequency detector 11 which can be used in the embodiment shown in FIG. 3. In FIG. 4, the phase/frequency detector 11 is implemented as a digitally operating circuit. An output 111 is coupled to an input of a digital loop filter 6. An output of the loop filter 6 is coupled to the digitally controlled oscillator 3 via a DCO gain normalization block (not shown). At an output of the digitally controlled oscillator 3, the output frequency of the digital PLL (DPLL) is provided. Additionally, the output of the digitally controlled oscillator is coupled to an input 112 of the phase/frequency detector 11. The oscillator may be coupled to the input of the phase/frequency detector 11 via the frequency divider 4. It is also useful to connect the output of the oscillator 3 to an input 112 of the phase/frequency detector 11 without intervening divider.

The phase/frequency detector 11 according to the embodiment shown in FIG. 4 comprises a reference phase accumulator 15. A signal input of the reference phase accumulator 15 receives a frequency control_1 signal. An output of the reference phase accumulator 15 is coupled to an input of the phase detector 16. An output of the phase detector 16 is coupled to the output 111 of the phase/frequency detector 11. The feedback input 112 of the phase/frequency detector 11 is coupled to an oscillator phase accumulator 17 at its clock input terminal. The output of the oscillator phase accumulator 17 is coupled, via a sampler 18, to an inverting input of the phase detector 16.

A fractional error correction block 19 in the phase/frequency detector 11 has an output 191 which is coupled to an additional non-inverting input of the phase detector 16. The output signal provided at the output 191 of the fractional error correction block 19 is produced by a multiplier or gain element 192. The multiplier or gain element 192 combines a DCO period normalization signal with a signal provided at an output of a time-to-digital (TDC) block 193. A TDC circuit, in general, converts a time difference between incoming signals into a digital information. The TDC block 193 receives, at a signal input, the feedback signal 112, namely the output frequency of the digitally controlled oscillator 3. A clock input of the TDC block 193 is coupled to a reference frequency input terminal 23. The reference frequency input terminal 23 is also coupled, via a synchronization block 194, to clock inputs of the reference phase accumulator 15 and of the sampler 18, respectively. A clock input of the synchronization block 194 itself is coupled to the output of the digitally controlled oscillator 3 which is coupled to feedback signal input 112.

According to an embodiment of the phase/frequency detector 11 of FIG. 4, the internal states of the reference phase accumulator 15, of the oscillator phase accumulator 17 and of the TDC block 193 and optionally of the sampler 18 and/or the synchronization block 194 can be read out of the phase frequency detector 11 and forwarded to the control unit 7 to be saved. The saved internal states correspond to respective frequency channels of the PLL. Said saved internal states can be written back to the mentioned subunits 15, 17, 193 and optionally subunits 18 and/or 194, respectively. Write back of the internal states to sampler 18 and/or synchronization block 194 can be achieved by setting or resetting the units 18 and 194, respectively, to a defined state.

Figure 5:
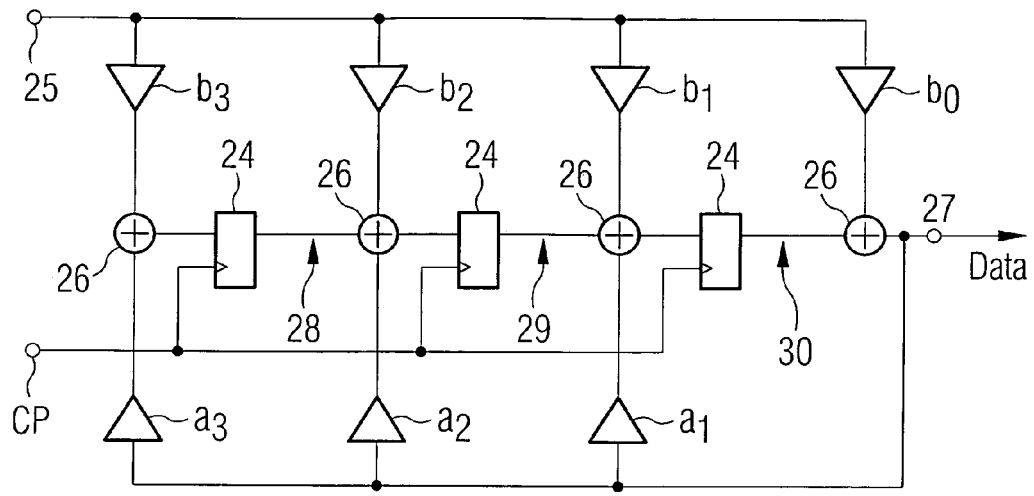
FIG. 5 is a logic diagram illustrating an embodiment of a loop filter.

FIG. 5 shows an exemplary embodiment of a possible implementation of a digital loop filter. FIG. 5 shows a infinite impulse response (IIR) filter of third order. Three registers 24 receive a clock pulse signal CP. A data stream is received by input terminal 25 and multiplied by different coefficients b0, b1, b2, b3. These multiplied values are combined by adders 26 with respective feedback values of the data stream at the output terminal 27. The feedback values are weighted with coefficients a1, a2, a3 by multiplication. A set of internal states are provided at the outputs of the registers 24 and are referenced by the reference symbols 28, 29, 30 in FIG. 5. A finite impulse response filter (FIR) is also possible for digital loop filter 6.

According to one embodiment of the invention, the registers 24 are connected such that a shift register is formed to read/write internal states. The registers 24 of the loop filter of FIG. 5, in the embodiment, can be coupled serially as a partial scan path of, for example, a global scan path. A scan path, in general, provides additional circuitry to registers in order to enable write and read access during a test mode. In one embodiment according to the invention, the partial scan path of the generally known scan path that includes the shown registers 24 is modified so that the to be saved states of the filter can be read and forwarded to the memory 8 and, when hopping to the same frequency again, can be written back from memory 8 through the partial scan path. The scan path functionality is modified according to one embodiment of the invention so that it is useful during the non-test mode.

According to an embodiment, the output signal of the loop filter at the data output 27 is kept constant during sequentially reading and/or writing information from/to the registers 24, respectively.

Figure 6:
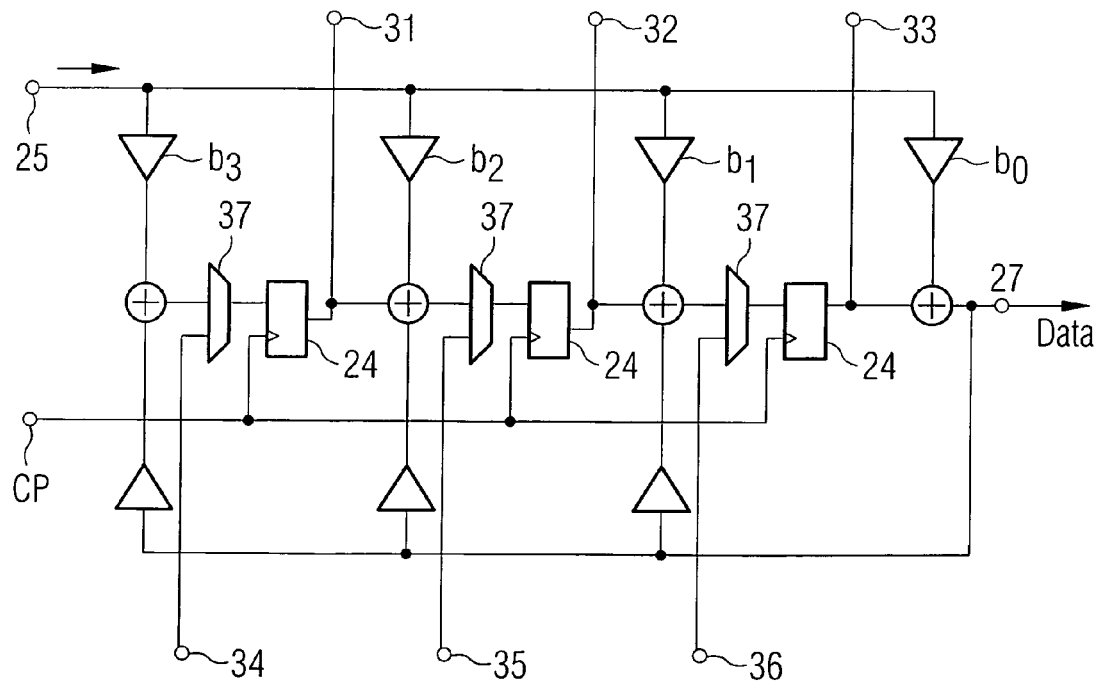
FIG. 6 is a logic diagram illustrating a further embodiment of a loop filter.

FIG. 6 shows an alternative embodiment of a digital loop filter. The circuit of FIG. 6 is based on the circuit of FIG. 5 and, to the extent that the circuits are identical, is not described again here. In addition to FIG. 5, a parallel output is provided through output taps 31, 32, 33 coupled to the respective outputs of the registers 24. At the outputs 31, 32, 33, the internal states 28, 29, 30 can be directly read as a digital word.

Moreover, to write internal states into the loop filter, additional input terminals 34, 35, 36 are provided that are combined with the data inputs of the flip flops 24 using additional logic gates 37. The input terminals 34, 35, 36 are provided in parallel to the data inputs of the flip flops 24. The additional logic gates 37 are coupled between the summing nodes 26 and the registers 24, respectively. By doing this, internal states of, for example, a pre-stored frequency channel can be directly written into the registers of the loop filter.

As an alternative to the loop filters of FIG. 5 or 6, it is also possible to use, for example, flip-flops with asynchronous set and reset inputs.

In another alternative embodiment, it is also possible to switch between different groups of registers of a loop filter rather than explicitly reading out and writing back from the loop filter.

Figure 7:
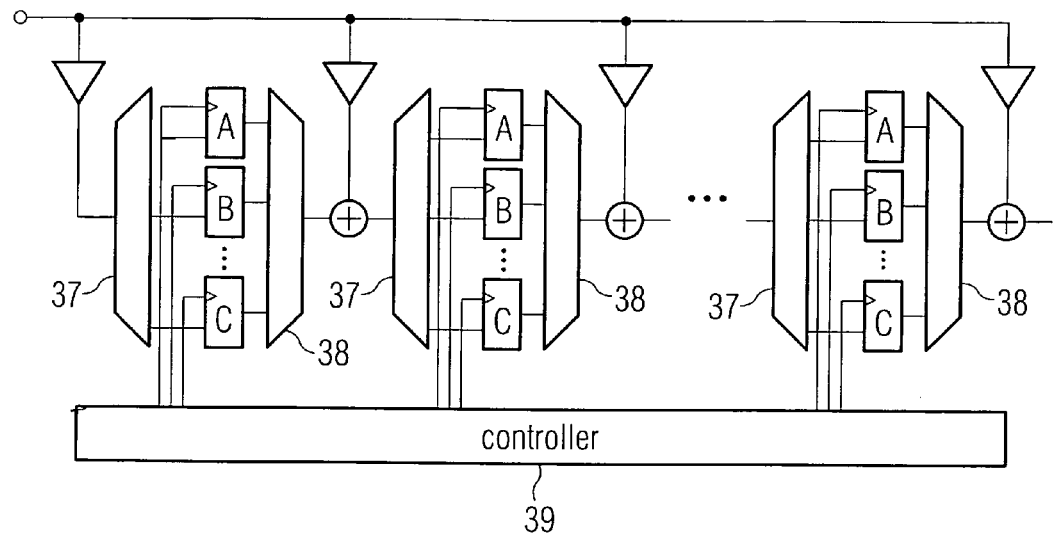
FIG. 7 is a logic diagram illustrating another embodiment of a loop filter.

FIG. 7 shows an example of an embodiment of a loop filter having several groups of registers which can be activated and deactivated, respectively, selectively in groups.

According to FIG. 7, each register 24 of FIG. 6 is replaced by several registers A, B, C that are coupled in parallel and that can be activated selectively using multiplexers and demultiplexers 37, 38, respectively, that are coupled upstream and downstream of the registers. The control of activation/deactivation is performed by a controller 39 which is coupled to respective clock inputs of the register groups A, B, C.

For example, a first group of registers A are assigned to a first frequency channel, a second group of registers B are assigned to a second frequency channel, and a third group of registers C are assigned to a third frequency channel of a synthesizer. Depending on the application, more or less groups of registers A, B, C may be provided.

According to one embodiment of the invention, during operation of the loop filter, only one group of registers A, B, or C is activated at a time, while all other groups of registers are deactivated at that time. The groups of registers that are deactivated hold the last known internal state that they had before deactivation.

As an alternative, other implementations of digital filters like direct forms, lattice filters et cetera can be used in an analogous manner.

Figure 8:
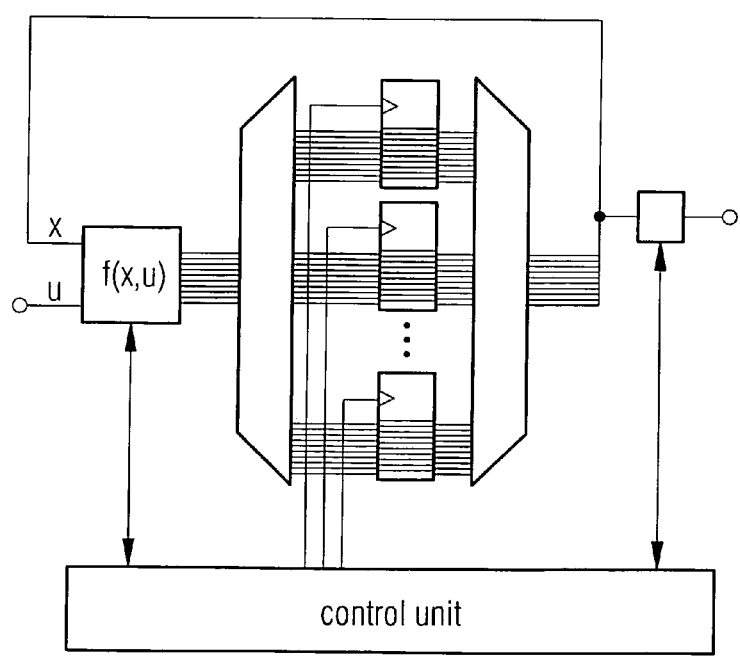
FIG. 8 is a logic diagram illustrating a further embodiment of a loop filter.

FIG. 8 shows an embodiment of a loop filter, at which, within one cycle period, a jump from one internal state to an earlier internal state is possible. FIG. 8 is another exemplary representation of the principle shown FIG. 7, that is useful for implementing the filter in a general purpose device which is software controlled. Such a general purpose device may be a digital signal processor (DSP). In the representation of FIG. 8, a group of registers A, B, C can be reused for higher filter orders and subsequent register stages.

Figure 9:
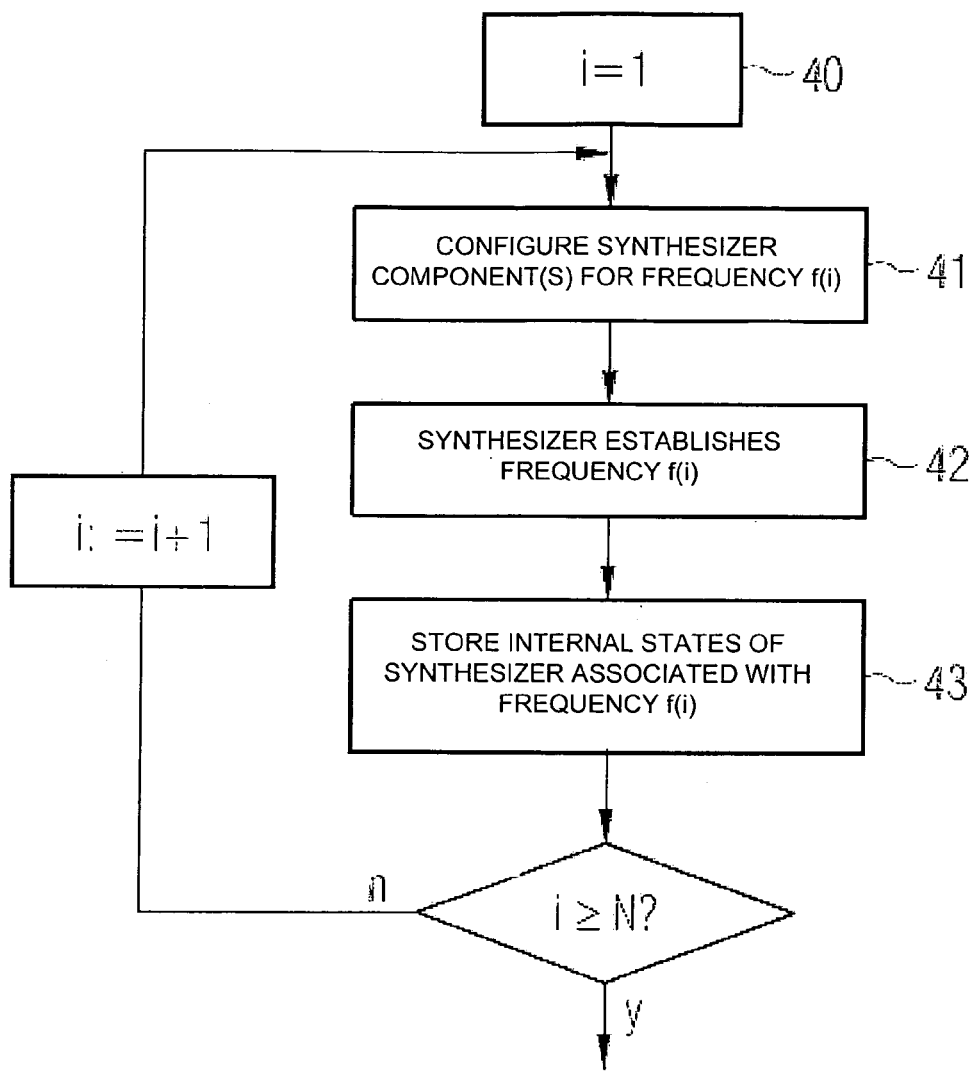
FIG. 9 is a flowchart illustrating an exemplary embodiment of a method of initializing a phase-locked loop.

FIG. 9 is a flowchart illustrating an example of an initialization method of a phase-locked loop according to one embodiment of the invention. According to FIG. 9, internal states are generated and stored, wherein the internal states correspond to a respective frequency channel of the synthesizer. While the exemplary method is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention.

At 40, an internal counter i is set to 1, wherein the vector of frequencies that may be generated comprises the frequencies f1 to fN. Having the counter set to i=1, a phase/frequency detector and/or a loop filter are configured for the frequency f(i) at 41.

At 42, the synthesizer settles onto that frequency and locks. Internal states of the synthesizer being in a settled condition are stored in step 43. Optionally, a phase error at the input of the loop filter is also stored. At 41 to 43 are repeated for each of the N frequency channels that may occur during later normal operation. When the internal states for all desired frequency channels are obtained, then the counter i equals N, and a normal operation mode, for example a frequency-hopping mode, may start.

FIG. 10 shows an example of an embodiment of a normal operation mode of a synthesizer using frequency-hopping.

Initially, the synthesizer waits for a jump command, the jump command requesting a new frequency channel f(i). During act 50, the synthesizer may be in a closed-loop operation. It is periodically checked whether a jump command is present at 51. While no jump command is present, an inner loop comprising acts 50 and 51 is repeated. If a jump command is received, then act 52 is entered, wherein the regular operation of the loop filter is stopped, e.g. by using clock gating at input 9 of the loop filter 6 of FIGS. 2 and 3, for example.

At 53, internal states of the synthesizer that may comprise internal states, e.g. of the loop filter and/or of the optional divider and/or of the phase/frequency detector and/or a phase error as well, are stored in a memory for the current frequency channel f(j). At 54, internal states of the synthesizer that correspond to the new frequency f(i) are read from the memory and restored into the synthesizer. The internal states may comprise internal states of the loop filter. The output of the filter is activated again.

At 55, the process waits until the digitally controlled oscillator has settled to a new frequency and the phase/frequency detector has calculated the corresponding phase error. Optionally, the phase error is detected at 56, for example using phase error detector 13, and compared to a previously stored phase error corresponding to that new frequency.

At 57, a correction value is calculated and added such that the desired phase error is reproduced. At 58, the loop filter is switched on again, which means that the control loop of the PLL is closed and the control is activated again. At 59, the internal counter is updated by setting j=i. The PLL waits for the next jump command.

According to one embodiment, a synthesizer arrangement comprises a digitally controlled oscillator, a phase/frequency detector comprising a first input coupled to an output of the digitally controlled oscillator and comprising a second input, a digital loop filter coupled between an output of the phase/frequency detector and an input of the digitally controlled oscillator. The digital loop filter comprises means for reading and/or writing internal states of the digital loop filter.

According to another embodiment, a phase-locked loop comprises a phase/frequency comparator comprising a reference input, a feedback input and an output, a loop filter comprising an input coupled to the output of the phase/frequency comparator and comprising an output, an oscillator comprising a control input coupled to the loop filter output and comprising an output coupled to the feedback input. The loop filter comprises a plurality of sets of internal states of which one set of internal states can be activated.

In yet another embodiment, a frequency-hopping synthesizer comprises an oscillator, a phase detector and a loop filter that are coupled together in order to form a phase-locked loop, wherein the loop filter comprises means to activate a respective set of internal states out of a plurality of sets of internal states.

An embodiment of a method of initializing a phase-locked loop comprises configuring the phase-locked loop to provide a first frequency, activating the phase-locked loop, when the phase-locked loop has locked onto the first frequency, and writing a set of internal states of the phase-locked loop corresponding to the first frequency into a memory.

According to a method of frequency-hopping in a synthesizer, the synthesizer comprising a loop filter, the method comprises saving a set of internal states of the loop filter corresponding to a first operating frequency of the synthesizer, and loading a set of internal states into the loop filter, wherein the set of internal states of the loop filter correspond to a second operating frequency of the synthesizer.

According to an embodiment, a fast-hopping frequency synthesizer uses a digital phase-locked loop instead of an analog phase-locked loop. The fast-hopping frequency synthesizer according to an embodiment jumps between well defined frequency channels. The frequency channels that might occur for the PLL are known a priori. Any possible frequency which may occur can be tuned in. When the PLL has settled, internal states of the loop filter can be stored before switching to a different frequency. If, later during normal operation, it is switched back to the respective frequency, a content of a memory is restored into the loop filter and the circuit will start working again at the settled state which it has left before.

When the stored values are active in the filter again, the closed-loop operation of the digitally controlled oscillator can be resumed after a very short settling time according to an embodiment.

According to an embodiment, it is unlikely that the operating conditions of the PLL in the time between two frequency-hops, which has a duration of, for example, several ten nanoseconds, change so much that an error which might potentially occur, would be of remarkable significance.

The storing of internal states is performed, according to an embodiment, at the end of normal operation at that frequency, right before jumping to a new frequency.

In an embodiment, the storing of internal states is performed at every frequency change. However, in alternative embodiments, it is also possible to save the internal states at that specific frequency channel f(j) during normal operation of the synthesizer with a given repetition interval. The repetition interval may be periodic.

Depending on the implementation of the phase detector, it is possible, in addition to reading and writing back internal states of the filter, to couple a correction signal to an input signal of the loop filter for phase correction purposes. This might be desirable in some applications since the phase relationship between an output signal of the digitally controlled oscillator, which may be downscaled when using a frequency divider, on the one hand and a reference signal on the other hand might get lost if switching to a different frequency channel is performed. According to this embodiment, before changing a frequency, not only internal states of a filter but also an input value of the filter are temporarily stored. Switching back to that respective frequency, in a first step, the internal filter states are reconstructed according to an embodiment. In a second step according to that embodiment, a phase offset is determined and, using a correction term, is set to the desired value that has been stored. After that, the normal control loop operation is resumed. According to an embodiment, power losses are reduced. According to an embodiment, a periodically addressed read-only memory with downstream digital-to-analog converter can be disposed of. Reduced power consumption is important for applications like ultra-wideband (UWB) systems, which are suited for use in the field of short-range mobile communication.

According to an embodiment, during initialization, the following is carried out for each possible frequency:

Configure the PLL, comprising a loop filter, a phase detector and a divider, for this frequency. Wait until transients have decayed. Store internal states of the loop filter and a phase error in a memory or shadow latches.

According to an embodiment, a hopping or regular operating mode comprises the following steps: for the current frequency, store internal states of a loop filter and/or the divider and/or the phase/frequency detector and a phase error in memory or shadow latches.

For configuring a new frequency, disable the clock of the filter and reload corresponding internal states to the loop filter. This results in the oscillator being reconfigured and starting to settle. Wait until the oscillator has settled. Measure a phase error and correct it with a value from the memory, for example, by adding the phase correction value to the input signal of the loop filter or by reconfiguring the phase detector. Reactivate the clock of the filter, which results in the PLL regulating the frequency again. Normal operation is resumed afterwards.

According to an embodiment of the invention, internal state variables are read/written back to the loop filter and/or the phase detector without affecting a subsequent stage in the circuit.

Although specific embodiments have been illustrated and described herein, it will be appreciated by those of ordinary skill in the art, that any arrangement which is calculated to achieve the same purpose may be substituted for the specific embodiments shown. It is to be understood, that the above description is intended to be illustrative and not restrictive. This application is intended to cover any adaptations or variations of the invention. Combinations of the above embodiments and many other embodiments will be apparent to those of skill in the art upon reading and understanding the above description. The scope of the invention includes any other embodiments and applications in which the above structures and methods may be used. The scope of the invention should, therefore, be determined with reference to the appended claims along with the scope of equivalents to which such claims are entitled.

It is emphasized that the Abstract is provided to comply with 37 C.F.R. section 1.72(b) requiring an abstract that will allow the reader to quickly ascertain the nature and gist of the technical disclosure. It is submitted with the understanding, that it will not be used to interpret or limit the scope or meaning of the claims.

What is claimed is:

1. A frequency synthesizer, comprising:
    a digitally controlled oscillator, comprising an input and an output;
    a detector comprising an input coupled to the output of the digitally controlled oscillator, and another input configured to receive a reference signal, and an output;
    a loop filter coupled between the output of the detector and the input of the digitally controlled oscillator;
    a memory unit operably coupled to the loop filter and configured to save internal states of the loop filter; and
    an interface operably associated with the loop filter, and configured to read and write a respective one set of internal states from and into the loop filter, respectively.

2. The frequency synthesizer of claim 1, wherein the loop filter comprises a digital loop filter.

3. The frequency synthesizer of claim 1, wherein the detector comprises one of a phase detector, a frequency detector and a phase/frequency detector.

4. The frequency synthesizer of claim 1, wherein during operation the digitally controlled oscillator is configured to produce a signal of a desired frequency out of a set of possible frequencies, and wherein a respective set of internal states corresponds to one of the set of possible frequencies, and further wherein the loop filter has the set of internal states that corresponds to the desired frequency.

5. The frequency synthesizer of claim 4, wherein the loop filter further comprises a plurality of sets of registers, wherein each set of registers is configured to store a respective set of internal states therein.

6. The frequency synthesizer of claim 1, wherein the interface comprises a serial interface, and wherein the loop filter comprises registers that are configured to form a shift register operable to read or write the respective set of internal states from or into the registers, respectively.

7. The frequency synthesizer of claim 6, wherein the shift register comprises a portion of a scan path used during a non-test mode operation of the frequency synthesizer.

8. The frequency synthesizer of claim 1, further comprising:

a divider coupled between the output of the oscillator and the input of the detector; and wherein the memory unit is operably coupled to the divider and configured to save internal states of the divider therein.

9. A phase-locked loop, comprising:

a comparator configured to compare a reference input and a feedback input and generate a comparison result at an output;

a loop filter configured to process the comparison result and generate a control signal at an output thereof;

an oscillator comprising a control input coupled to the loop filter output and an output coupled to the feedback input of the comparator and configured to generate an oscillator signal based on the control signal at the control input;

wherein the loop filter has a plurality of sets of internal states associated therewith, wherein one of the sets of internal states is selectively activated during operation of the phase-locked loop to produce a desired frequency.

10. The phase-locked loop of claim 9, further comprising:

a control unit operably coupled to the loop filter and configured to activate one of the sets of internal states.

11. The phase-locked loop of claim 10, wherein the control unit is operably coupled to the comparator and configured to activate one of a set of available internal states associated with the comparator.

12. The phase-locked loop of claim 11, further comprising a memory configured to save internal states of the comparator.

13. The phase-locked loop of claim 10, wherein the control unit is configured to generate at least one frequency control signal to be applied to one of the comparator and the loop filter to control an operating frequency of the phase-lock loop.

14. The phase-locked loop of claim 9, further comprising:

a memory unit configured to save internal states of the loop filter.

15. The phase-locked loop of claim 14, further comprising a divider coupled between the output of the oscillator and the feedback input of the comparator, wherein the memory unit is configured to save internal states of the divider received through a control unit.

16. The phase-locked loop of claim 9, wherein the comparator comprises one of a phase comparator, a frequency comparator and a phase/frequency comparator.

17. The phase-locked loop of claim 9, further comprising:

a phase correction block configured to alter the comparison result of the comparator based on a phase error.

18. The phase-locked loop of claim 17, further comprising:

a phase error detector configured to detect a phase error associated with the comparator and forward the phase error for mitigation by the phase correction block.

19. A frequency-hopping synthesizer, comprising:

a controllable oscillator, a phase detector and a loop filter that are coupled together to form a phase-locked loop; and a control unit configured to activate a respective set of internal states out of a plurality of sets of internal states within the loop filter, the loop filter comprising the plurality of sets of internal states therein, wherein one of the sets of internal states is selectively activated during operation of the phase-locked loon to produce a desired frequency.

20. The frequency-hopping synthesizer of claim 19, wherein the loop filter comprises a digital loop filter.

21. The frequency-hopping synthesizer of claim 20, further comprising a memory configured to store the plurality of sets of internal states for the loop filter, wherein each set of internal states corresponds to a synthesizer frequency.

22. A frequency-hopping synthesizer, comprising:

a controllable oscillator, a phase detector and a loop filter that are coupled together to form a phase-locked loop; and a control unit configured to activate a respective set of internal states out of a plurality of sets of internal states within the loop filter wherein the control unit is coupled to at least one control terminal of the loop filter and configured to read and write the set of internal states from and into the loop filter, respectively.

23. A method of initializing a phase-locked loop, comprising:

configuring the phase-locked loop to provide a frequency;

activating the phase-locked loop; and writing a set of internal states of a loop filter of the phase-locked loop corresponding to the frequency into a memory when the phase-locked loop has locked onto the frequency.

24. The method of claim 23, further comprising:

configuring the phase-locked loop to provide another frequency;

activating the phase-locked loop; and writing a set of internal states of the phase-locked loop corresponding to the other frequency into the memory when the phase-locked loop has locked onto the other frequency.

25. A method of frequency-hopping in a frequency synthesizer comprising a loop filter, the method comprising:

saving in a memory a first set of internal states of the loop filter corresponding to a first operating frequency of the frequency synthesizer;

loading a second set of internal states into the loop filter from the memory, the set of internal states of the loop filter corresponding to a second operating frequency of the frequency synthesizer; and wherein the frequency synthesizer comprises one of a phase detector, a frequency detector and a phase/frequency detector, the method further comprising:

saving in the memory a set of internal states of one of: the phase detector, the frequency detector and the phase/frequency detector when changing from the first operating frequency to the second operating frequency; or wherein the frequency synthesizer comprises a divider coupled in a feedback path of the synthesizer, the method further comprising:

saving in the memory a set of internal states of the divider when changing from the first operating frequency to the second operating frequency; or the method further comprising: saving a phase error corresponding to the first operating frequency of the frequency synthesizer;

detecting a current phase error when the synthesizer has settled onto the second frequency;

comparing the current phase error to a stored phase error corresponding to the second operating frequency of the frequency synthesizer; and calculating a phase correction value and applying a compensation phase value such that the stored phase error corresponding to the second operating frequency of the synthesizer is reproduced by the synthesizer.

* * * * *

UNITED STATES PATENT AND TRADEMARK OFFICE
CERTIFICATE OF CORRECTION

PATENT NO. : 7,696,829 B2 Page 1 of 1
APPLICATION NO. : 11/524674
DATED : April 13, 2010
INVENTOR(S) : Stephan Henzler et al.

It is certified that error appears in the above-identified patent and that said Letters Patent is hereby corrected as shown below:

Column 11, claim 19, line 62; please replace "loon" with --loop--

Signed and Sealed this

Eighth Day of June, 2010

David J. Kappos
*Director of the United States Patent and Trademark Office*